United States Patent [19]

Rieger et al.

[11] Patent Number: 5,645,174
[45] Date of Patent: Jul. 8, 1997

[54] RACK FOR AN EQUIPMENT CABINET

[75] Inventors: Uwe Rieger, Karlsbad; Henning Wick; Hans-Martin Schwenk, both of Straubenhardt; Frank Rost, Neuenbürg, all of Germany

[73] Assignee: Schroff GmbH, Straubenhardt, Germany

[21] Appl. No.: 557,806

[22] Filed: Nov. 14, 1995

[30]  Foreign Application Priority Data

Nov. 18, 1994  [GB]  United Kingdom .................... 9418448

[51] Int. Cl.$^6$ .................................................. A47F 7/00
[52] U.S. Cl. ............................................. 211/26; 108/107
[58] Field of Search ............................ 211/26, 189, 191, 211/192, 41; 361/724, 725, 726, 727; 312/223.1; 108/107

[56]  References Cited

U.S. PATENT DOCUMENTS

| | | | |
|---|---|---|---|
| 3,754,517 | 8/1973 | Hassel et al. | 108/107 X |
| 3,905,483 | 9/1975 | Patrick | 211/26 X |
| 4,564,111 | 1/1986 | Suttles | 211/189 |
| 5,065,873 | 11/1991 | Tseng | 108/107 X |
| 5,284,254 | 2/1994 | Rinderer | 211/26 |
| 5,311,397 | 5/1994 | Harshberger et al. | 361/726 X |
| 5,349,132 | 9/1994 | Miller et al. | 361/724 X |
| 5,353,198 | 10/1994 | Kabat et al. | 211/41 X |
| 5,372,262 | 12/1994 | Benson et al. | 211/189 X |
| 5,478,145 | 12/1995 | Kamachi | 108/107 X |
| 5,488,543 | 1/1996 | Mazura et al. | 211/41 X |

*Primary Examiner*—Korie Chan
*Assistant Examiner*—Sandra Snapp
*Attorney, Agent, or Firm*—Spencer & Frank

[57]  ABSTRACT

A rack for an equipment cabinet comprises a rectangular base plate, an identically constructed roof plate and four profiled pillars. For the fastening of the profiled pillars, various fastening means are provided at the base plate and the roof plate. Three groups of four fastening holes each serve as fastening means at the corners of the base plate and the roof plate, as well as respectively three sections of four pairs of stop lugs each, which are allocated to the fastening holes in a definite manner. A fastening bore is provided in each profiled pillar, and the profile of each profiled pillar is provided with at least one profiled rib which, when the profiled pillars are positioned and screwed in, is disposed in a gap between a pair of stop lugs.

8 Claims, 3 Drawing Sheets

RACK FOR AN EQUIPMENT CABINET

CROSS-REFERENCE TO RELATED APPLICATION

This application claims the priority of Patent Application Ser. No. G 94 18 448.8 filed in the Federal Republic of Germany on Nov. 18, 1994, the subject matter of which is incorporated herein by reference.

BACKGROUND OF THE INVENTION

The invention relates to a rack for an equipment cabinet for the installation of electronics modules, having a rectangular base plate, an identically constructed roof plate, at least four profiled pillars, and fastening means with which the profiled pillars can be fastened with their respective ends to the upper sides of the base plate and roof plate.

The invention is for electronics cabinets which are intended for the installation of modules of different dimensions.

Racks for equipment cabinets or electronics cabinets designed to receive modules, whose dimensions are based on an inch-based measurement grid, have been known for a long time already. Lately, cabinets for modules and other assemblies following a metric grid also have become known. For example, a rack for an equipment cabinet for the installation of industrial electronics modules, on which the invention is based, is shown, for example, in FIG. 4 of Applicants' utility model G 94 05 618.8. This rack is comprised of a lower base plate, an identically configured upper cover plate as well as four parallel, perpendicular, profiled posts extending between the base plate and roof plate.

The cabinet racks themselves are known as welded or screwed-together structures in which the vertical profiled pillars are mounted in fixed, unchangeable positions. Therefore, modules governed by the inch-based measurement grid can only be installed in electronics cabinets which are built according to the same grid; the same applies to modules according to the metric system. In a mixed installation or for applications with the respectively other measurement standard, adapter elements that are more or less costly must be prepared and mounted. This situation is extremely unsatisfactory, and this is where the invention comes in.

SUMMARY OF THE INVENTION

The object of the invention is to provide a rack for an equipment cabinet intended for the installation of modules, in which cabinet modules of the inch-based as well as of the metric measurement grid can be installed by using the same components (base plate and roof plate as well as profiled pillars).

This object and others are achieved by the invention according to which a rack for an equipment cabinet, which is intended for the installation of electronics modules, is provided, characterized in that in the region of each of the four corners of the base plate and the roof plate, three groups of four fastening holes each are respectively provided, namely an outer group in which the fastening holes are arranged in a square layout, an inner group in which the fastening holes are arranged in the same square layout as in the outer group, a center group in which the fastening holes are arranged in a rectangular layout, with two fastening holes each in each individual group being disposed on the longitudinal side of a rectangle, which is disposed within the edges of the base plate and the roof plate, and the three groups being next to each other and spaced apart from one another. From the base plate and the roof plate, three sections of four pairs of stop lugs project respectively therefrom. The sections include an outer section which is allocated to the outer group of fastening holes, and an inner section which is allocated to the inner group of fastening holes, and a center section which is allocated to the center group of fastening holes, with the pairs of the outer section and of the inner section being respectively disposed in an identical, rectangular layout and the pairs of the center section in an almost square layout. Two pairs of each section are arranged on a straight line, which is parallel to the longitudinal side of the rectangle, and each pair forms a gap. Each profiled pillar has at least one fastening bore starting from each frontal face, which bore is designed to receive a fastening screw extending through a fastening hole. The profile of each profiled pillar has at least one profiled rib provided next to the fastening bore and which, when the profiled pillars are positioned on the base plate and the roof plate and have been screwed to these, is disposed in the gap formed by a pair of stop lugs adjacent to the fastening bore. Because of the proposed arrangement of the fastening means for the profiled pillars on the base plate and on the roof plate, on the one hand, and on the profiled pillars, on the other, it is possible to mount these profiled pillars on the base plate and the roof plate in several different positions in two directions (namely according to width and depth) or to move the pillars without any problems. The four fastening holes of one group alone allow four positions, namely two of them for modules of the inch-based measurement grid and two for the metric grid. The further two groups add eight positions. Given these altogether twelve options, all installation requirements can be met by using the same components.

BRIEF DESCRIPTION OF THE DRAWINGS

These and other features and advantages of the invention will be further understood from the following detailed description of the preferred embodiment with reference to the accompanying three drawing sheets in which.

DETAILED DESCRIPTION OF THE PREFERRED EMBODIMENT

Figure 1:
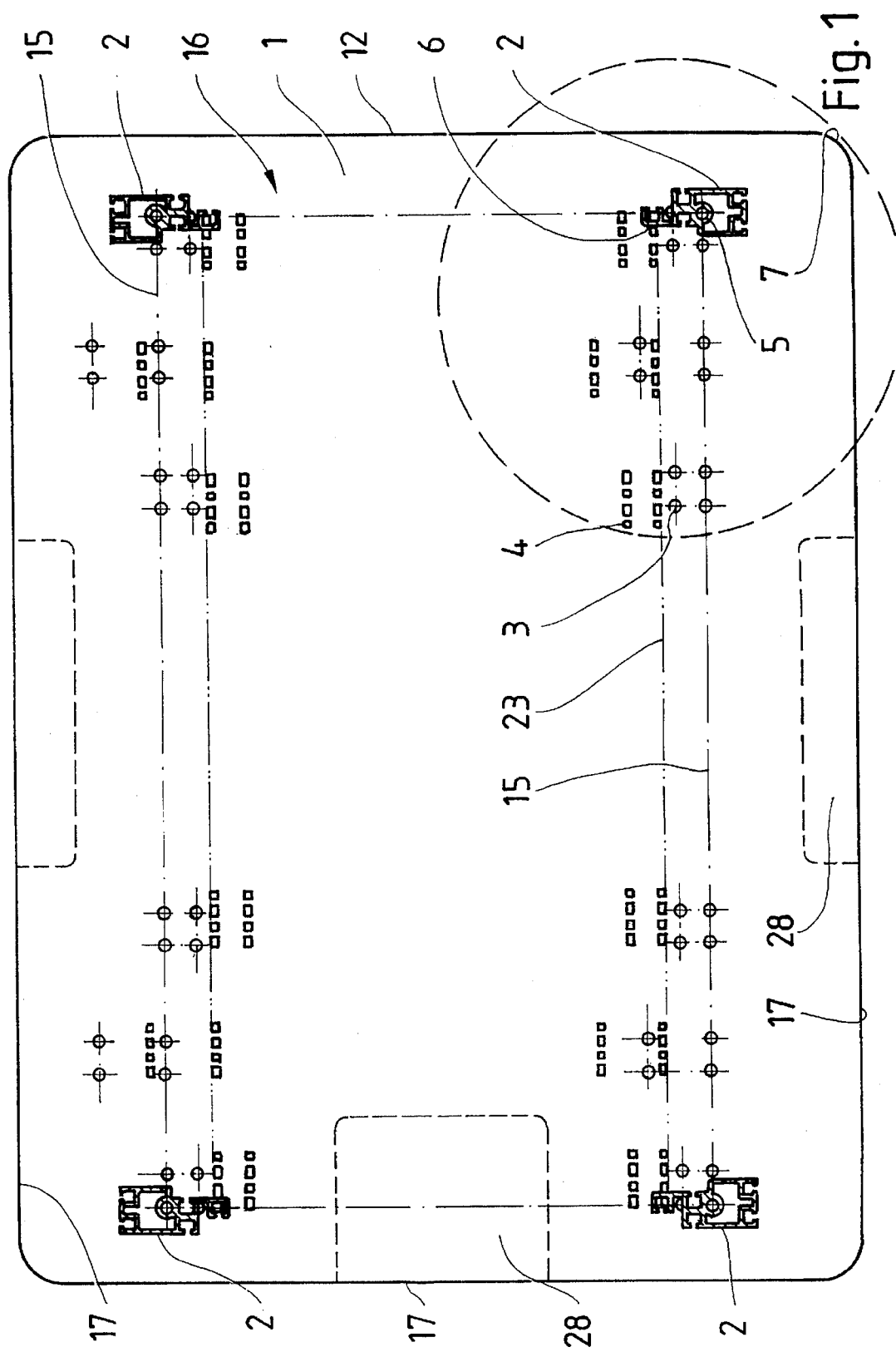
FIG. 1 is a plan view of a rack for an equipment cabinet in a reduced horizontal section, looking at the base plate, having four profiled pillars arranged at the corners.

The rack according to the invention (see FIG. 1) comprises a base plate 1, a roof plate (not shown) which corresponds with the base plate 1, and four identical profiled pillars 2 which connect base plate 1 and the roof plate with one another. The fastening means provided at the upper side of base plate 1 and the roof plate, as well as at the ends of the profiled pillars 2, make it possible to arrange the profiled pillars in different positions so as to fasten assemblies of different widths and depths, as well as of different standards, in the rack. Thus, the spacing between the pillars can be changed in increments in the direction of both the width and the depth of the cabinet. This is done by using the same components, with adapter elements not being necessary.

As fastening means for securing the profiled pillars 2 to the base plate 1 and the roof plate, fastening holes 3 and stop lugs 4 are provided in or on the base plate 1 and the roof plate, which cooperate with and correspond to the arrangement of fastening bores 5 and profiled ribs 6 of the profiled pillars 2. Fastening screws (which are not shown) are used for the fastening.

At each of the four corners 7 (see FIG. 1) of base plate 1 and the roof plate, three groups 8, 9 and 10, each comprising four fastening holes 3, are respectively provided. The outer group 8 (see FIG. 2), which is adjacent to the narrow side 12 of the base plate 1, and the inner group 9, which is disposed in the center region of the base plate 1, are arranged in square layouts 13 of identical size, while the center group 10 has a rectangular layout 14. The arrangement of the fastening holes 3 is such that two of the fastening holes 3 of each of the three groups 8, 9 and 10 have their centers on the longitudinal sides 15 of a rectangle 16, which is disposed symmetrically within the edges 17 of the base plate 1 (and the roof plate). Typically, the two other fastening holes 3 of each of the three groups 8, 9, 10 are disposed more towards the center of base plate 1, i.e., inward of the longitudinal side 15. An exception to this may be constituted by two fastening holes 3 of the center groups 10, which may be located outside of the rectangle 16, as shown in FIG. 1, along edge 17.

The three groups 8, 9 and 10 (FIG. 2) are disposed next to one another in a row and are spaced apart from one another at a distance A. Within each group 8, 9 and 10, the two outer fastening holes 3 are spaced from the two inner fastening holes 3 at a distance (a), which corresponds to the difference of the grid measurements between the inch-based system and the metric system of the electronic modules which are to be inserted between the profiled pillars 2.

Three sections 18, 19 and 20 of stop lugs 4 (FIG. 2) respectively project from the base plate 1 (and from the roof plate), and have the shape of low prisms. The outer section 18 of stop lugs 4 is allocated to the outer group 8 of fastening holes 3. This means that outer section 18 stands at a small distance from outer group 8. The inner section 19 is allocated to the inner group 9, and the center section 20 is allocated to the center group 10 of fastening holes 3. The four pairs of stop lugs 4 of the outer section 18 and of the inner section 19 are respectively disposed in an identical, rectangular layout 21, while the four pairs of stop lugs 4 of the center section 20, which is disposed inbetween center section 20 and outer section 18, are arranged in an almost square layout 22 into which reach two fastening holes 3 of the center group 10.

Respectively, two pairs of stop lugs 4 of each of the three sections 18, 19, 20 are arranged on a straight line 23, which runs parallel to the longitudinal side 15 of rectangle 16. Each of the pairs forms a gap 24, which is disposed between the frontal faces of the two stop lugs 4 adjoining the respective gap 24. All gaps 24 are of identical size.

The groups 8, 9 and 10, together with the sections 18, 19 and 20 which are allocated to the holes 3, are arranged along the edges 17 of base plate 1 and the roof plate such that the space between the outer group 8 at the corner 7 and the outer group of fastening holes 3 at the opposite corner correspond to the space between the respective center groups 10 and the inner groups 9 also located at the aforementioned corners. Thus, the associated profiled pillars 2 can be positioned in such a manner that a module having an identical width as the aforementioned spacing, be it an inch-based system or a metric system, can be positioned either on the one side of the base plate 1, on the other side of the base plate 1, or in the center of the base plate 1 (roof plate). The arrangement in which two fastening holes 3 of the two center groups 10 are disposed outside of the rectangle 16 (as described above and as illustrated in FIG. 1) makes it possible to position the profiled pillars 2 such that their depth spacing vis-a-vis the other contemplated positions is enlarged.

The fastening bores 5 of the profiled pillars 2 start from each of the two terminal frontal faces of a profiled pillar 2. These are, for example, pocket bores having an inside thread to receive the fastening screw that is to be screwed in. Each of these fastening screws extends through the associated fastening hole 3 when the profiled pillar 2 is mounted.

Figure 2:
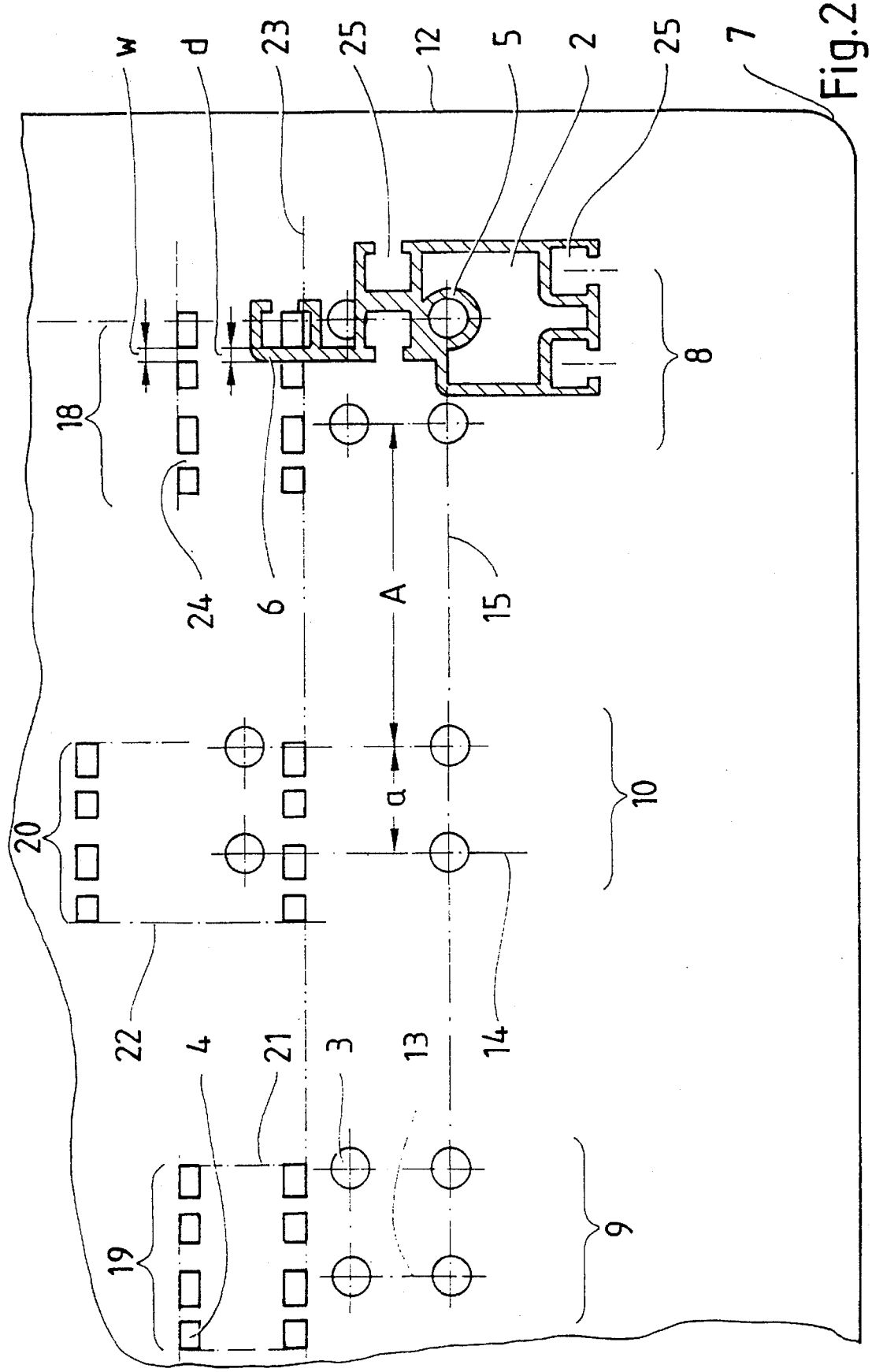
FIG. 2 shows a detail from the horizontal section according to FIG. 1, approximately in full scale, having a profiled pillar which is configured as a hollow section.

The profile of each profiled pillar 2 is provided with the profiled rib 6 which is provided at a distance from the fastening bore 5 (see FIG. 2). This profiled rib 6 (which extends over the entire length of the profiled pillar 2) corresponds with the fastening hole 3 and the two associated stop lugs 4 such that, when the profiled pillar 2 is positioned on the base plate 1 and fastened to the base plate as well as to the roof plate, the profiled rib 6 is disposed in the gap 24 which is formed by the adjoining pair of stop lugs 4. The profiled pillar 2 is prevented from turning during installation as well as during the fastening process itself via its profiled rib 6 of gap 24.

Figure 3:
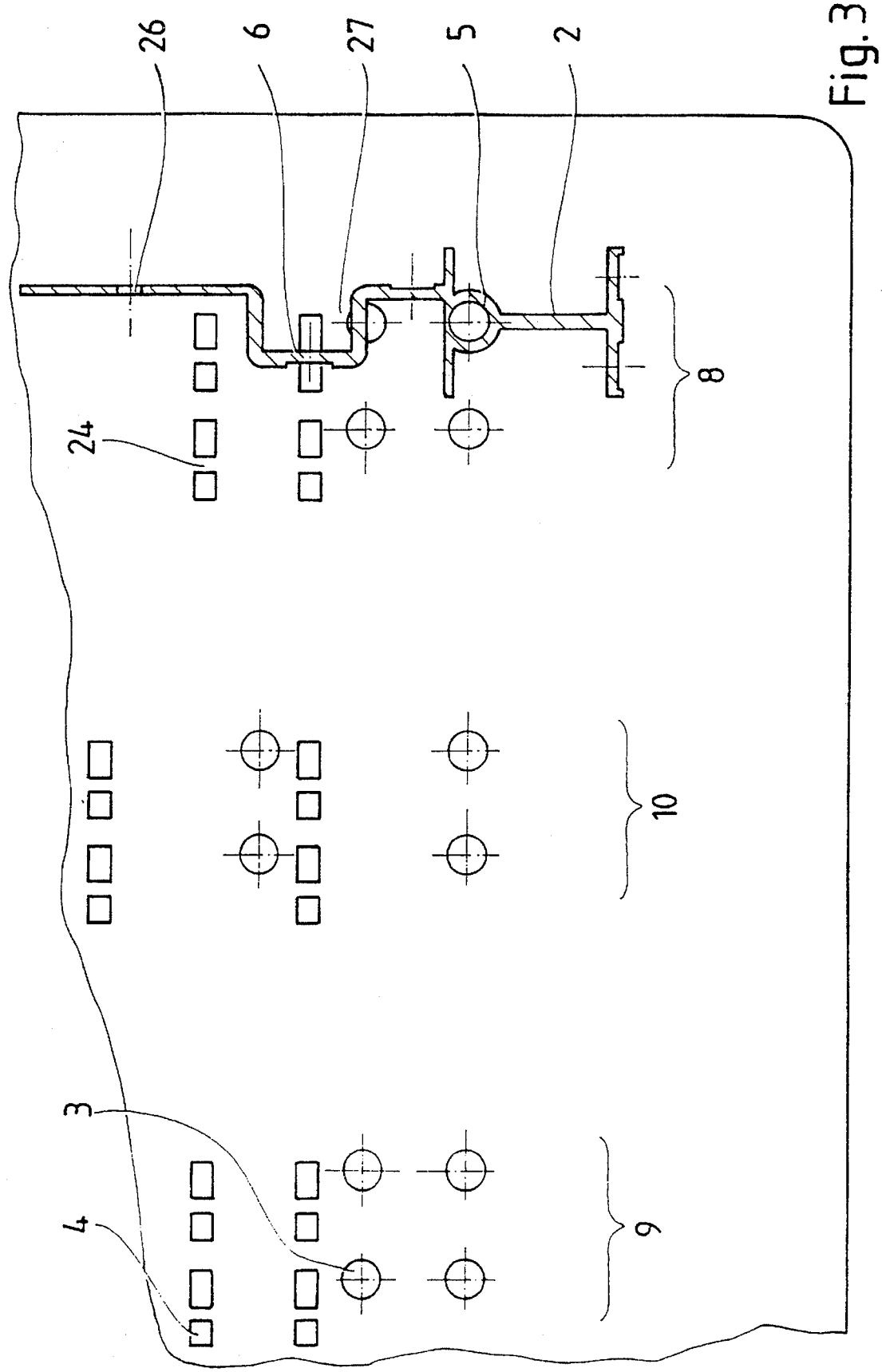
FIG. 3 shows a detail from the horizontal section according to FIG. 1 having a profiled pillar disposed at the corner configured as a flat section.

The profiled pillar 2 represented in FIG. 2 is a hollow section, while the profiled pillar 2 illustrated in FIG. 3 is configured as a flat section. The proposed arrangement of fastening holes 3 and stop lugs 4 allows the positioning and the turn-resistant fastening of the hollow section as well as of the flat section because, for both, the position of the profiled rib 6 relative to the fastening bore 5 is the same.

The thickness (d) of the profiled ribs 6 (FIG. 2) is only slightly smaller than the width (w) of the gap 24 formed by the pairs of stop lugs 4, thus accomplishing an exact fit.

Those profiled pillars 2 having a hollow section (see FIG. 2) have several T-slots 25 into which cage nuts or fastening blocks can be inserted so as to be able to screw on component elements. The other profiled pillars 2 which are configured as flat sections (see FIG. 3) have a row of holes 26 extending in the longitudinal direction for the screwing on of adapters. Furthermore, this profiled pillar 2 forms an open cable channel 27 in the longitudinal direction.

The base plate 1 is provided with two edge recesses 28 having an oblong-rectangular layout—indicated by dashed lines in FIG. 1—which start from the edges 17 of the long side of base plate 1 and are provided so that cable harnesses can be fed to the modules without being hindered. Such an edge recess 28 is also located on the short side of the base plate 1.

It will be understood that the above description of the present invention is susceptible to various modifications, changes and adaptations, and the same are intended to be comprehended within the meaning and range of equivalents of the appended claims.

What is claimed is:

1. A rack for an equipment cabinet for the installation of electronics modules, comprising:

(A) a rectangular roof plate and an identically constructed base plate, said roof plate and said base plate each having four corner regions, each respective corner region including:

(1) three groups of four fastening holes each, two of the four fastening holes in each group being disposed on the longitudinal side of a rectangle located within the edges of the base plate and the roof plate, the three groups being located next to each other and spaced apart from one another, said three groups comprising:

(a) an outer group in which the fastening holes are arranged in a square layout;

(b) an inner group in which the fastening holes are arranged in the same square layout as in the outer group; and (c) a center group in which the fastening holes are arranged in a rectangular layout; and (2) three sections of four pairs of stop lugs each, said stop lugs projecting from the respective base plate and the roof plate, said three sections comprising:

(a) an outer section allocated to the outer group of fastening holes, the pairs of stop lugs of the outer section being positioned in a rectangular layout;

(b) an inner section allocated to the inner group of fastening holes, the pairs of stop lugs of the inner section being disposed in a rectangular layout identical to the rectangular layout of the stop lugs of the outer section; and (c) a center section allocated to the center group of fastening holes, the pairs of stop lugs of the center section being disposed in an essentially square layout; wherein two pairs of stop lugs of each section are arranged on a straight line which is parallel to the longitudinal side of the rectangle, and wherein each pair of stop lugs forms a gap; and (B) at least four profiled pillars, each having:

(1) at least one fastening bore for receiving a fastening screw extending through a respective fastening hole; and (2) at least one profiled rib provided next to the fastening bore and being disposed in the gap formed by a pair of stop lugs adjacent to the fastening bore when the profiled pillars are positioned on and screwed to the base plate and the roof plate, whereby the respective ends of the profiled pillars are fastened to an upper side of the base plate and the roof plate.

2. The rack according to claim 1, wherein the stop lugs have the shape of a low prism.

3. The rack according to claim 1, wherein all of the gaps formed by each pair of stop lugs have the same size.

4. The rack according to claim 1, wherein a thickness of the profiled ribs of the profiled pillars is smaller than a width of the gap formed by the pairs of stop lugs.

5. The rack according to claim 1, wherein the profiled pillars are each provided with at least one T-slot extending in a longitudinal direction of the profiled pillar.

6. The rack according to claim 1, wherein the profiled pillars are each provided with at least one row of holes arranged in a longitudinal direction of the profiled pillar.

7. The rack according to claim 1, wherein the profiled pillars are provided with a cable channel extending in a longitudinal direction of the profiled pillar.

8. The rack according to claim 1, wherein the base plate and the roof plate have at least one edge recess.

* * * * *

UNITED STATES PATENT AND TRADEMARK OFFICE
CERTIFICATE OF CORRECTION

PATENT NO. : 5,645,174
DATED : July 8, 1997
INVENTOR(S) : Uwe Rieger et al

It is certified that error appears in the above-indentified patent and that said Letters Patent is hereby corrected as shown below:

On the title page, item [30], the second line should read:  --Nov. 18, 1994 [DE] Germany....... 9418448--.

Signed and Sealed this

Second Day of September, 1997

*Attest:*

BRUCE LEHMAN

*Attesting Officer*     *Commissioner of Patents and Trademarks*